United States Patent
Schmid et al.

(10) Patent No.: US 7,851,769 B2
(45) Date of Patent: Dec. 14, 2010

(54) MOTORIZED MANIPULATOR FOR POSITIONING A TEM SPECIMEN

(75) Inventors: Andreas Karl Schmid, Berkeley, CA (US); Nord Andresen, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 273 days.

(21) Appl. No.: 12/253,528

(22) Filed: Oct. 17, 2008

(65) Prior Publication Data

US 2009/0146075 A1 Jun. 11, 2009

Related U.S. Application Data

(60) Provisional application No. 60/980,678, filed on Oct. 17, 2007.

(51) Int. Cl.
G21K 5/10 (2006.01)
(52) U.S. Cl. .............................. 250/442.11; 250/443.11; 250/441.11; 250/306; 250/307; 250/309; 250/310; 250/311; 310/323.27; 310/323.17; 310/328; 310/333; 310/12.14; 310/40 R
(58) Field of Classification Search ............ 250/442.11, 250/443.11, 441.11, 306, 307, 309–311; 310/323.27, 323.17, 328, 333, 12.14, 40 R
See application file for complete search history.

(56) References Cited

U.S. PATENT DOCUMENTS

| | | |
|---|---|---|
| 3,307,035 A | 2/1967 | Grasenick et al. |
| 4,019,109 A | 4/1977 | McCoy et al. |
| 4,507,597 A | 3/1985 | Trost |

(Continued)

FOREIGN PATENT DOCUMENTS

EP 1863066 A1 12/2007

(Continued)

OTHER PUBLICATIONS

Physik Instrumente GMBH & Co. KG, "High Performance Piezo Actuators for OEM, Industry and Research," Catalogue, Sep. 2005, pp. 1-25, Catalogue No. 118 05/09.17.

*Primary Examiner*—Jack I Berman
*Assistant Examiner*—Meenakshi S Sahu
(74) *Attorney, Agent, or Firm*—Scheinberg & Griner, LLP; Michael O. Scheinberg; David Griner (57) ABSTRACT

The invention relates to a motorized manipulator for positioning a TEM specimen holder with sub-micron resolution parallel to a y-z plane and rotating the specimen holder in the y-z plane, the manipulator comprising a base (2), and attachment means (30) for attaching the specimen holder to the manipulator, characterized in that the manipulator further comprises at least three nano-actuators ($3^a$, $3^b$, $3^c$) mounted on the base, each nano-actuator showing a tip ($4^a$, $4^b$, $4^c$), the at least three tips defining the y-z plane, each tip capable of moving with respect to the base in the y-z plane; a platform (5) in contact with the tips of the nano-actuators; and clamping means (6) for pressing the platform against the tips of the nano-actuators; as a result of which the nano-actuators can rotate the platform with respect to the base in the y-z plane and translate the platform parallel to the y-z plane.

25 Claims, 4 Drawing Sheets

U.S. PATENT DOCUMENTS

| | | |
|---|---|---|
| 4,785,177 A | 11/1988 | Besocke |
| 4,797,261 A | 1/1989 | Swann et al. |
| 5,089,708 A | 2/1992 | Asselbergs |
| 5,696,421 A | 12/1997 | Zumeris et al. |
| 5,986,270 A | 11/1999 | Bormans et al. |
| 6,246,060 B1 | 6/2001 | Ackeret et al. |
| 6,252,333 B1 | 6/2001 | Iino et al. |
| 6,388,262 B1 | 5/2002 | Alani |
| 6,635,887 B2 | 10/2003 | Kwan et al. |
| 6,819,029 B2 | 11/2004 | Ohno et al. |
| 6,841,788 B1 | 1/2005 | Robinson et al. |
| 6,849,989 B2 | 2/2005 | Schmid et al. |
| 6,855,926 B2 | 2/2005 | Palmer et al. |
| 6,940,210 B2 | 9/2005 | Karrai et al. |
| 6,963,068 B2 | 11/2005 | Asselbergs et al. |
| 7,005,636 B2 | 2/2006 | Tappel |
| 7,034,316 B2 | 4/2006 | Wagner et al. |
| 7,053,383 B2 | 5/2006 | Moore |
| 7,381,968 B2 | 6/2008 | Tanaka et al. |
| 7,381,971 B2 | 6/2008 | Moore et al. |
| 7,511,282 B2 | 3/2009 | Agorio et al. |
| 2004/0178372 A1 | 9/2004 | Rasmussen |
| 2004/0185586 A1 | 9/2004 | Yasutake et al. |
| 2005/0035302 A1 | 2/2005 | Morrison |
| 2006/0219919 A1 | 10/2006 | Moore et al. |
| 2008/0173813 A1* | 7/2008 | Van De Water et al. ..... 250/307 |
| 2008/0302961 A1 | 12/2008 | Tashiro et al. |
| 2009/0000400 A1 | 1/2009 | Hayles et al. |
| 2009/0294690 A1 | 12/2009 | Moore et al. |

FOREIGN PATENT DOCUMENTS

| | | |
|---|---|---|
| EP | 1868225 A1 | 12/2007 |
| EP | 2009421 | 12/2008 |
| JP | 62236692 | 10/1987 |
| JP | 3281188 | 12/1991 |
| JP | 04206333 | 7/1992 |
| JP | 5200638 | 8/1993 |
| JP | 08106873 | 4/1996 |
| JP | 09236755 | 9/1997 |
| JP | 2002319364 | 10/2002 |
| JP | 2002334818 | 11/2002 |
| JP | 2003065745 | 3/2003 |
| JP | 2003115527 | 4/2003 |
| JP | 2004223673 | 8/2004 |
| JP | 2005026467 | 1/2005 |
| WO | 9620495 | 7/1996 |
| WO | 99/59192 | 11/1999 |
| WO | 2008051880 | 5/2008 |

* cited by examiner

MOTORIZED MANIPULATOR FOR POSITIONING A TEM SPECIMEN

This application claims priority from U.S. Provisional Application No. 60/980,678 filed on Oct. 17, 2007, which is hereby incorporated by reference.

STATEMENT OF GOVERNMENTAL SUPPORT

The invention described and claimed herein was made in part utilizing funds supplied by the U.S. Department of Energy under Contract No. DE-AC02-05CH11231. The Government has certain rights in this invention.

TECHNICAL FIELD OF THE INVENTION

The invention relates to a motorized manipulator for positioning a component with sub-micron resolution parallel to a y-z plane and rotating the component in the y-z plane, the manipulator comprising a base and attachment means for attaching the component to the manipulator.

BACKGROUND OF THE INVENTION

Such a manipulator is described in U.S. Pat. No. 6,388,262.

The known manipulator is used to position and orient a component in the form of a specimen in a Transmission Electron Microscope (TEM).

The manipulator comprises a support arm housing, which sticks through the housing of the TEM on which the manipulator is mounted. One end of the support arm housing is thereby located inside the apparatus, and thus surrounded by vacuum, while the other end is exposed to atmosphere. To avoid leakage the support arm housing shows an O-ring seal where it passes through the housing of the TEM, thereby sealing the interior of the TEM from atmosphere.

The support arm housing shows a bore from end to end. In this bore a specimen holder is mounted. The specimen holder comprises a rod with a ball joint located between its ends. One end is located inside the vacuum of the TEM, while the other side is exposed to atmosphere. The ball joint closely fits the bore of the support arm housing, and shows an O-ring seal, thereby sealing the interior of the TEM from atmosphere. The ball joint allows the rod to move with respect to the support arm housing with a number of degrees of freedom. The end of the rod inside the TEM is equipped to hold a TEM specimen grid with a specimen placed thereon, while the other end is connected to motorized drives. Moving the distal end of the rod located in vacuum in an X-Y plane (perpendicular to the particle-optical axis of the TEM) results in a translation of the specimen holder in that plane, while a rotation of the rod along its axis is translated in a rotation of the specimen holder in said plane. Hereby it is possible to position and orient the specimen, located inside the TEM, from the outside with the motorized drives.

As known to the person skilled in the art a TEM employs a beam of particles in the form of electrons with an energy of typically between 80-300 keV travelling along a particle-optical axis. The beam of electrons is, for example, focused by particle-optical lenses and, for example, deflected by particle-optical deflectors.

A thin specimen, also known as a sample, with a thickness of typically between 50 and 100 nm is placed on the particle-optical axis and is irradiated by the electrons. Some of the electrons pass through the specimen and are imaged on a detector.

Commercially available TEM's may nowadays achieve a spatial resolution of less than 0.1 nanometers.

Such a resolution is only achievable when during the time needed to acquire an image, the specimen is stationary with respect to the particle-optical axis within 0.1 nm. Any movement of the specimen with respect to the particle-optical axis, e.g. due to thermal drift or due to e.g. acoustic vibrations of the manipulator holding the specimen, deteriorates the image. Acquiring an image takes typically between several seconds to several minutes. The requirements for the stability of the manipulator with respect to the particle-optical axis are thus extremely rigid.

When using extreme magnifications the field of view (FoV) is extremely small, e.g. 50·50 nm$^2$. It is a challenge to avoid a jerky movement of the image when positioning the specimen at this magnification. Not only must the smallest displacement of the specimen be very small; the movements must also be performed very smooth. Furthermore any backlash or after-effects of movement, such as residual movement or vibration, must be minimal.

The resolution of electron microscopes is rapidly improving due to the introduction of particle-optical correctors correcting spherical and/or chromatic aberrations of one or more of the particle-optical lenses. Commercial instruments are available that achieve resolutions below 0.05 nm under optimum conditions. As a result the demand on the mechanical stability of the manipulator is becoming more severe.

A problem of the manipulator described in U.S. Pat. No. 6,388,262 is that is has a multitude of parts and couplings that must be very precisely machined. As a result such a manipulator is expensive. Also, due to the number of elements producing friction and/or play, such as the O-ring seals, it is difficult to construct such a manipulator with the required stability and smoothness of motion while lacking after-effects. The friction may introduce a jerky movement, as the motors must overcome the friction when making a small step, resulting in slip/stick effects. The play between parts may result in inaccuracy of the positioning.

A related problem is that the length of the rod, the number of couplings and the O-ring seals result in a soft coupling between the housing of the apparatus (and thus the particle-optical axis) and the end where the specimen resides. As known to the person skilled in the art, a stiff coupling (as opposed to a soft coupling) between elements is preferred when counteracting the effects of vibrations.

Another problem of the aforementioned manipulator is that part of the manipulator sticks out of the apparatus. Variations in air pressure outside the instrument, due to climate control, ambient temperature changes, etc., may thereby cause positional changes of the attachment mechanism inside the vacuum, and thus undesired movement of the specimen.

AIM OF THE INVENTION

There is a need for an improved manipulator.

SUMMARY OF THE INVENTION

To that end the manipulator according to the invention is characterized in that the manipulator further comprises:
- at least three nano-actuators mounted on the base, each nano-actuator showing a tip, the at least three tips defining the y-z plane, each tip capable of moving with respect to the base in the y-z plane,
- a platform in contact with the tips of the nano-actuators,
- clamping means for pressing the platform against the tips of the nano-actuators, as a result of which the nano-actuators can rotate the platform with respect to the base in the y-z plane and translate the platform parallel to the y-z plane.

In this context a nano-actuator is an actuator capable of realizing a movement with a resolution on the nanometer and sub-nanometer scale. Such a nano-actuator is commercially available from e.g. the company Physik Instrumente GmbH & Co. KG, Karlsruhe/Palmbach, Germany, as type P-112.03, as described in their catalogue "High performance piezo actuators for OEM, Industry and research", catalogue number 118 05/09.17, (September 2005), pages 1-24 and 1-25.

The platform can be translated with respect to the base by moving the tips in identical directions in the y-z plane. When the tips move tangentially to the circle on which the three nano-actuators are located in a clockwise direction, a clockwise rotation around the centre of the circle results. Moving in the counter-clockwise direction results in a counter-clockwise rotation. The manipulator according to the invention therefore provides three degrees of freedom: two translational and one rotational.

Due to the small number of moving parts a high stiffness of the manipulator can be realized. Apart from the nano-actuators themselves, no parts move over each other (provided that the normal force of the platform upon the tips is larger than the maximum frictional force of the interface of tip and platform, otherwise slip occurs). Therefore play and slip/stick effects are eliminated.

As known to the person skilled in the art, a nano-actuator can be very stiff. The type known as a piezo-actuator has no surfaces moving over each other, but relies on the flexing or shearing of piezo-ceramic material. The lack of faces moving over each other result in the elimination of after-effects, while the high stiffness offers improved performance pertaining to, for example, (acoustic) vibrations.

Since the actuators can be placed inside the apparatus (in vacuum), no mechanical vacuum feed-through is needed, and thereby the O-rings may be eliminated.

This results in a manipulator with a stiff coupling and without backlash, friction and/or play. Also, the effects of the environment of the apparatus (e.g. ambient temperature changes and air-pressure variations) are greatly reduced.

It is noted that the clamping means must press the surface of the platform against the tips with sufficient force. The force normal to the surface with which the tips are pressed on the surface determines, together with the friction coefficient between tips and surface, the maximum force before slip between the surface and the tips occurs. This force must thus be chosen sufficiently large to avoid slip due to unwanted acceleration as a result of, e.g., vibrations and required acceleration of the platform when starting or stopping movement of the platform with respect to the base.

In an embodiment of the manipulator according to the invention the nano-actuators are mounted on the platform instead of on the base.

This is an alternative location of the nano-actuators.

In another embodiment of the manipulator according to the invention the clamping means take the form of a spring-loaded counter-base, the counter-base pressed against the platform at the side opposite to the side where the platform contacts the tips.

In a further embodiment of the manipulator according to the invention the counter-base is equipped with a second set of at least 3 nano-actuators, each of the second set of nano-actuators on the counter-base showing a tip, each tip of the second set of nano-actuators capable of moving in the y-direction and the z-direction, the platform kept in contact with the tips of the second set of nano-actuators by the spring-loading, and the manipulator is equipped to keep the relative position of base and counter-base in the y-z plane substantially stationary.

In another embodiment of the manipulator according to the invention the platform shows one or more smooth surfaces, each of the tips of the nano-actuators in contact with one of the one or more smooth surfaces, each of the tips equipped to move with respect to the one or more smooth surfaces of the platform.

In this embodiment each of the tips contacts the platform at a smooth surface. Each tip may have its corresponding smooth surface, or several tips may share a common smooth surface.

In a preferred embodiment of the manipulator according to the invention the movement over the one or more smooth surfaces of the platform takes the form of slipping the tips over the one or more smooth surfaces of the platform.

By causing the tips to slip over the smooth surfaces, it is possible to re-position the tips with respect to the platform. As a result the translation and/or rotation that can be achieved in this preferred embodiment is larger than without re-positioning the tips with respect to the base.

Slipping of a tip over a smooth surface occurs when the sliding force, parallel to the plane of the smooth surface, between tip and smooth surface exceeds the maximum static frictional force between the two. This is realized by applying a quick displacement of the tip. It may take the form of sliding all tips simultaneously, sliding a tip from the first set of tips and the corresponding tip of the second set of tips, or sliding one tip at a time only over their corresponding smooth surfaces. Due to the inertia of the platform, the platform will hardly move. After completing the re-positioning, the tips and the platform show a high stiffness and any residual movement of the platform and the base are counter-acted.

It is remarked that, when a minority of the tips is re-positioned at a time, the remaining tips can keep the platform from moving and keep a stiff coupling between base and platform even during re-positioning. As the person skilled in the art will recognise, it is also possible to maintain a stationary movement of the platform by moving the platform with said majority of tips, while re-positioning a minority of the tips at a time.

In another embodiment of the manipulator according to the invention a sub-manipulator is mounted on the platform, said sub-manipulator equipped to move the attachment means with respect to the platform, and the attachment means attach the component to the sub-manipulator.

Such a sub-manipulator is described in e.g. pending U.S. patent application Ser. No. 11/861,721 filed Sep. 26, 2007.

In a further embodiment of the manipulator according to the invention the sub-manipulator is equipped to position the component along additional degrees of freedom.

By mounting a sub-manipulator on the manipulator according to the invention, the component may be positioned with additional degrees of freedom than when attaching the component solely to the manipulator.

In another embodiment of the manipulator according to the invention the nano-actuators are piezo-electric nano-actuators.

In still another embodiment of the manipulator according to the invention at least part of the base, the nano-actuators, the platform, the clamping means and the attachment means are equipped to be exposed to and to operate in a vacuum.

By mounting the manipulator inside the vacuum, minimum environmental effects are transferred to the attachment means, which dictate the position of the component (such as a specimen or specimen holder).

In a further embodiment of the manipulator according to the invention the vacuum is the vacuum of an interior portion of a particle-optical apparatus, said particle-optical apparatus comprising a particle source for producing a beam of particles and one or more particle-optical lenses, each of said particle source and particle-optical lenses centred round a particle-optical axis along which a beam of particles may travel.

By mounting the manipulator inside a particle-optical apparatus, such as a Transmission Electron Microscope (TEM), a Scanning Transmission Electron Microscope (STEM), a Scanning Electron Microscope (SEM), or a Focused Ion Beam (FIB) apparatus, a component can be positioned with respect to the particle beam employed in such apparatus. This component may be a specimen or a specimen holder, but may also be a particle-optical component such as an aperture or a multipole that must be aligned round the particle-optical axis.

In yet a further embodiment of the manipulator according to the invention the particle-optical apparatus is an electron microscope.

The manipulator is especially useful in a high-resolution particle-optical apparatus such as a TEM or a STEM.

In a still further embodiment of the manipulator according to the invention the manipulator is equipped with a through-hole in the base and a through-hole in the platform for passing the beam of particles.

By equipping the manipulator with a through-hole in e.g. the centre of the platform and the base and aligning the through-holes such that the particle-optical axis (along which the particles travel) passes through the through-holes, the component can be centred around the particle-optical axis. If the component is a specimen holder, this resembles a so-named top-entry stage as used in some TEM's. This embodiment may especially be attractive when positioning a particle-optical element such as an aperture, a zone plate or a multipole round the particle-optical axis of the apparatus In still a further embodiment of the manipulator according to the invention the particle-optical axis is substantially perpendicular to the y-z plane.

In this embodiment the platform and the particle-optical axis are aligned such that the component can be positioned (translated and rotated) in a plane perpendicular to the particle-optical axis. This orientation of the manipulator resembles a so-named side-entry specimen holder used in the majority of TEM's.

In another embodiment of the manipulator according to the invention the component is a particle-optical component.

The component may be e.g. a so-named aperture, a phase plate, or e.g. a multipole.

In still another embodiment of the manipulator according to the invention the component is a specimen holder and the manipulator is equipped to move the specimen holder.

In an aspect of the invention a method of operating the manipulator according to the invention is characterized in that repeatedly the steps of moving one or more tips with a speed sufficiently low to avoid slippage of the tips over the one or more smooth surfaces, and moving the one or more tips with a speed sufficiently high to cause slippage of the one or more tips over the one or more smooth surfaces, thereby repositioning the one or more tips with respect to the platform, are performed, as a result of which the platform is moved with respect to the base over a distance or over a angle of rotation larger than can be achieved without repositioning the tips with respect to the platform.

BRIEF DESCRIPTION OF THE DRAWINGS

The invention will be further elucidated on the basis of figures, in which identical reference numerals indicate corresponding elements. To this end.

DETAILED DESCRIPTION OF THE DRAWINGS

FIG. 1 schematic shows an embodiment of the manipulator according to the invention, in which one set of nano-actuators is used.

Figure 1A:
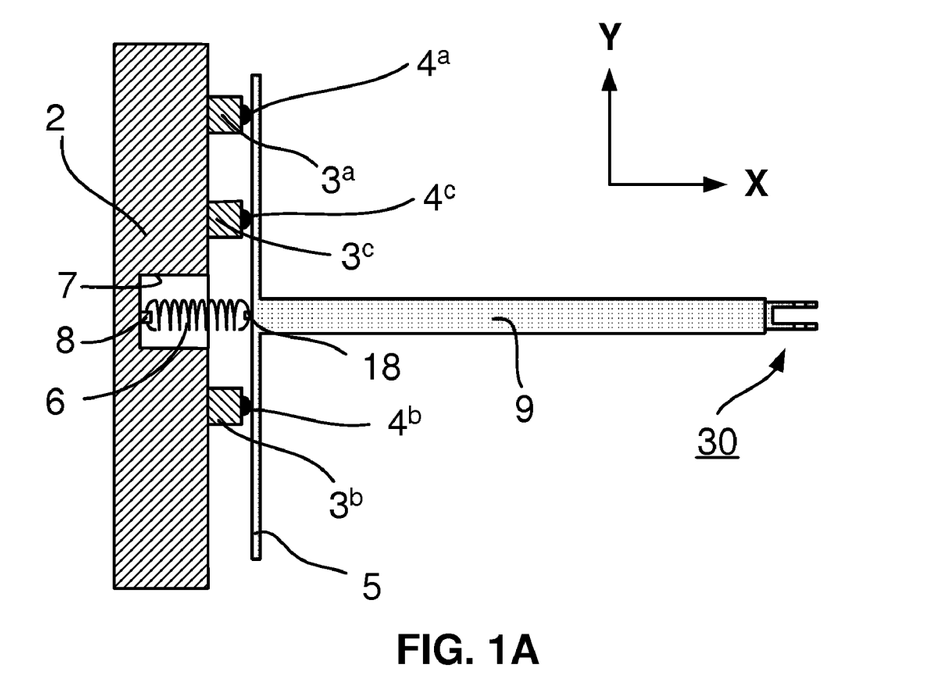
FIG. 1 schematic shows an embodiment of the manipulator according to the invention, in which one set of nano-actuators is used.

FIG. 1A shows a base 2 on which three nano-actuators $3^a$, $3^b$ and $3^c$ are mounted. Each of these nano-actuators shows a tip, $4^a$, $4^b$ and $4^c$, respectively. Platform 5 is pressed against these tips by clamping means in the form of a spring 6. One end of the spring is connected to a lip 8 in a recess 7 of the base, the other end to a lip 18 on the platform. From the platform, a rod 9 extends to perpendicular to the platform, the end remote from the platform ending in clamping means 30.

Figure 1B:
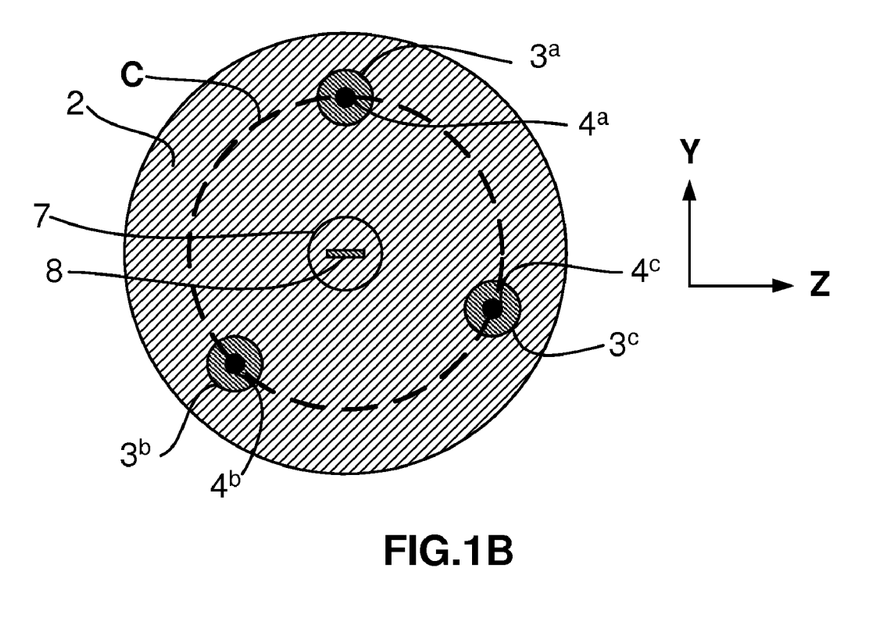

FIG. 1B shows a top view of the basis of the manipulator, that is, a view as seen from the side where the platform normally resides on the nano-actuators. FIG. 3B shows the mutual position of the nano-actuators and the position where the spring is mounted. As can be seen, the nano-actuators are spaced on a circle C.

As is clear from FIGS. 1A and 1B, a movement of the nano-actuators in the same direction (in the Y-Z plane) will cause a translation of the base in that direction. When moving the tips in a clockwise direction along circle C, the platform will rotate in a clockwise direction around the centre of the circle. It will be clear to the person skilled in the art that a mixture of movements results in a combined translation/rotation of the platform.

By changing the speed of the tips slowly, that is, with such a speed that the maximum frictional force is never exceeded, the tips will stay on one position on the surface of the platform. When changing the speed of the tips fast, that is, so fast that the lateral force exceeds the maximum (static) frictional force, the tip slips over the surface. At the moment that the force becomes smaller than the dynamic frictional force slipping will stop and the tip will be re-positioned on the platform.

It is noted that the speed at which slipping occurs is dependent on the normal force of the nano-actuators on the smooth surface, the friction coefficient between the two, and the inertia of the platform.

By using appropriate nano-actuators, e.g. the before mentioned P112.03 nano-actuators available from Physik Instrumente GbmH & Co, a minimum displacement of less than 1 nm can be achieved while a stroke in excess of 2 mm and a rotation of more than 360 degrees can be achieved. Said nano-actuators are also capable to operate in a vacuum and at liquid helium temperatures, thereby enabling a manipulator in e.g. a so-named cryo-TEM, that is a TEM in which the specimen is held at a cryogenic temperature.

It is noted that attachment means and associated specimen carriers cooperating with them are known per se. An example is described in European patent application EP06114632. Other embodiments of attachment means that may be used with this manipulator are known from some TEM's, such as the Polara™ of FEI Company, Hillsboro, USA.

Figure 2:
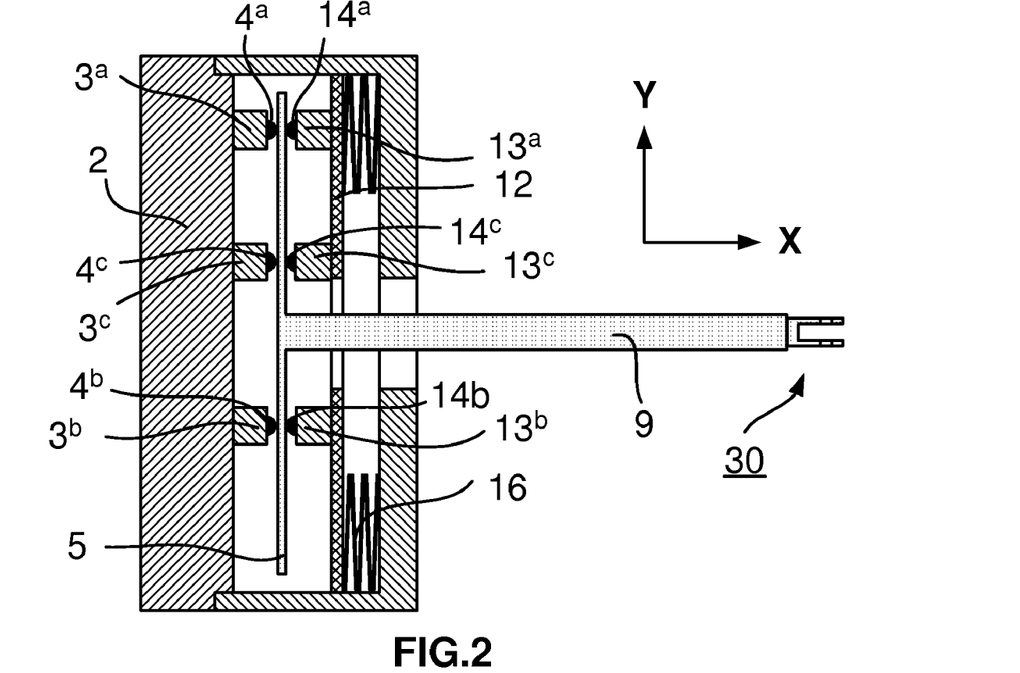
FIG. 2 schematically shows another embodiment of the manipulator, in which two sets of nano-actuators are used.

FIG. 2 schematically shows another embodiment of the manipulator, in which two sets of nano-actuators are used.

FIG. 2 can be thought to be derived from FIG. 1A. Where in FIG. 1 the clamping means took the form of a spring, the clamping means shown in figure comprises a counter-base 12, spring-loaded by a set of Belleville washers 16. The counter-base is pushed against the platform via a second set of nano-actuators $13^a$, $13^b$ and $13^c$, so that the platform is clamped between the two sets of nano-actuators. By moving corresponding nano-actuators together (thus $3^a$ together with $13^a$, etc.) in identical direction and amplitude, the base and counter-base are stationary with respect to each other, while the platform is moved between the two.

Figure 3:
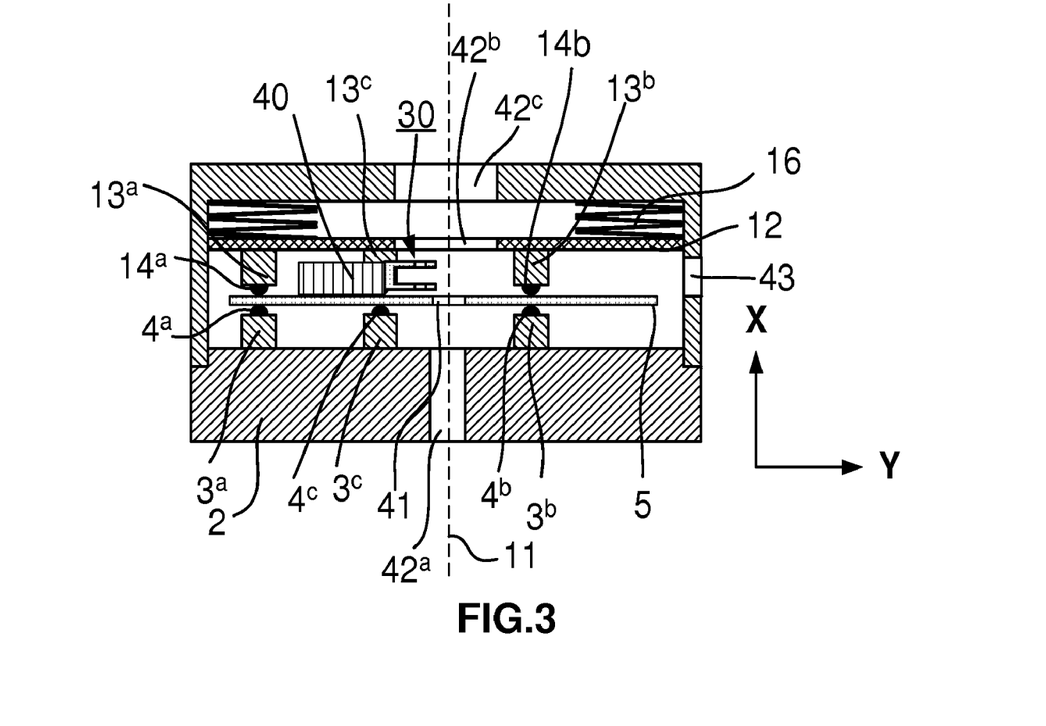
FIG. 3 schematically shows still another embodiment of the manipulator, in which a through-hole in the base and in the platform allows a beam of particles to pass through the manipulator.

FIG. 3 schematically shows still another embodiment of the manipulator, in which a through-hole in the base and in the platform allows a beam of particles to pass through the manipulator.

FIG. 3 shows a manipulator according to the invention in which a through-hole in the base and in the platform allow a beam of particles to pass through the manipulator.

FIG. 3 can be thought to be derived from FIG. 2. The rod 9 is deleted and a through-hole 41 is formed in the platform 5. Through-holes $42^a$, $42^b$ and $42^c$ are formed in the base. These through-holes 41, $42^a$, $42^b$ and $42^c$ allow a beam of particles travelling along a particle-optical axis 11 to pass through the manipulator.

Also shown schematically is a sub-manipulator 40 mounted on the platform, enabling the attachment means 30 to be positioned with more degrees of freedom than the three degrees of freedom (two translational and one rotational) provided by the manipulator described in FIGS. 1 and 2.

A further through-hole 43 in the side wall of the base 2 enables a specimen or specimen carrier to be introduced to the attachment means 30.

This embodiment of the manipulator may be mounted in a way similar to that of a top-entry stage as used in some TEM's, that is, on a pole piece of a magnetic lens.

It is noted that sub-manipulators are known per se. An example of a sub-manipulator that may be used as part of the manipulator according to the invention is described in pending U.S. patent application Ser. No. 11/861,721 filed Sep. 26, 2007.

The manipulator may be constructed to be compatible with the vacuum used in, e.g., a TEM. This vacuum is typically a vacuum between $10^{-6}$ mbar to $10^{-9}$ mbar, but may be a lower or a higher pressure.

The manipulator may also be constructed to be compatible with attachment means and a specimen holder both kept at a cryogenic temperature, e.g., the temperature of liquid nitrogen or liquid helium, or kept at an elevated temperature of, e.g., 300° C.

Figure 4A:
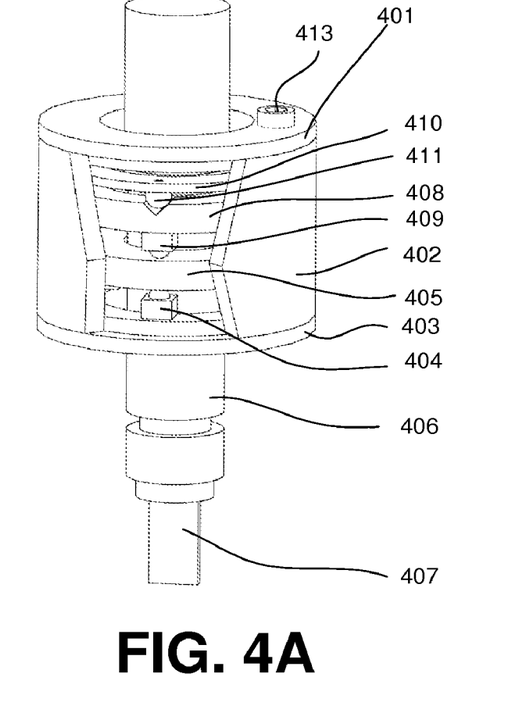
FIGS. 4A and 4B schematically depict an assembled (FIG. 4A) and an exploded (FIG. 4B) view of a manipulator according to the invention.
Figure 4B:
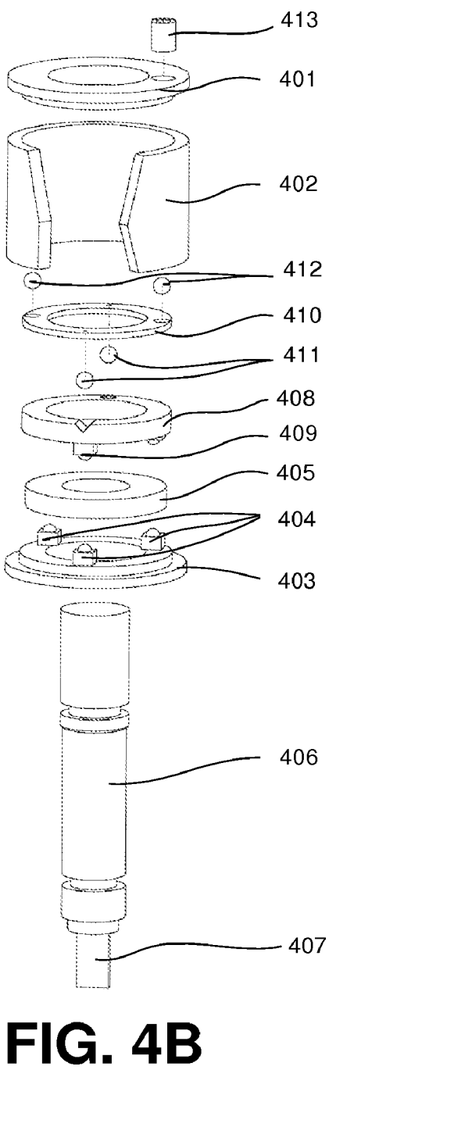

FIG. 4A and FIG. 4B schematically depict an assembled (FIG. 4A) and an exploded (FIG. 4B) view of a manipulator according to the invention.

A base comprising a housing 402, a top plate 401 and a bottom plate 403 form the outside of the manipulator. A set of nano-actuators 404 is mounted on the base (on the bottom plate) and move the platform 405 with respect to the base. Into a hole in the platform 405, a sub-manipulator 406 is attached, which can hold a specimen or a specimen holder by attachment means 407. A second set of actuators 409, mounted on counter-base 408, contacts the opposite side of the base, so that the platform (405) is clamped between the two sets of actuators (404, 409). The second set of nano-actuators is pressed to the base by spring 410 via two balls 411. The spring is forced towards the base by the bottom plate 401 of the base via two balls 412. As the two sets of balls are arranged 90 degrees apart from each other, they form together with spring 410 a cardanic spring assembly, ensuring that all actuators experience the same force. Screw 413 is used to adjust the force on spring 410, and thus the force on the actuators.

It is noted that in normal use (that is: when the displacement of the base is within normal range) platform 405 does not contact housing 402.

Figure 5:
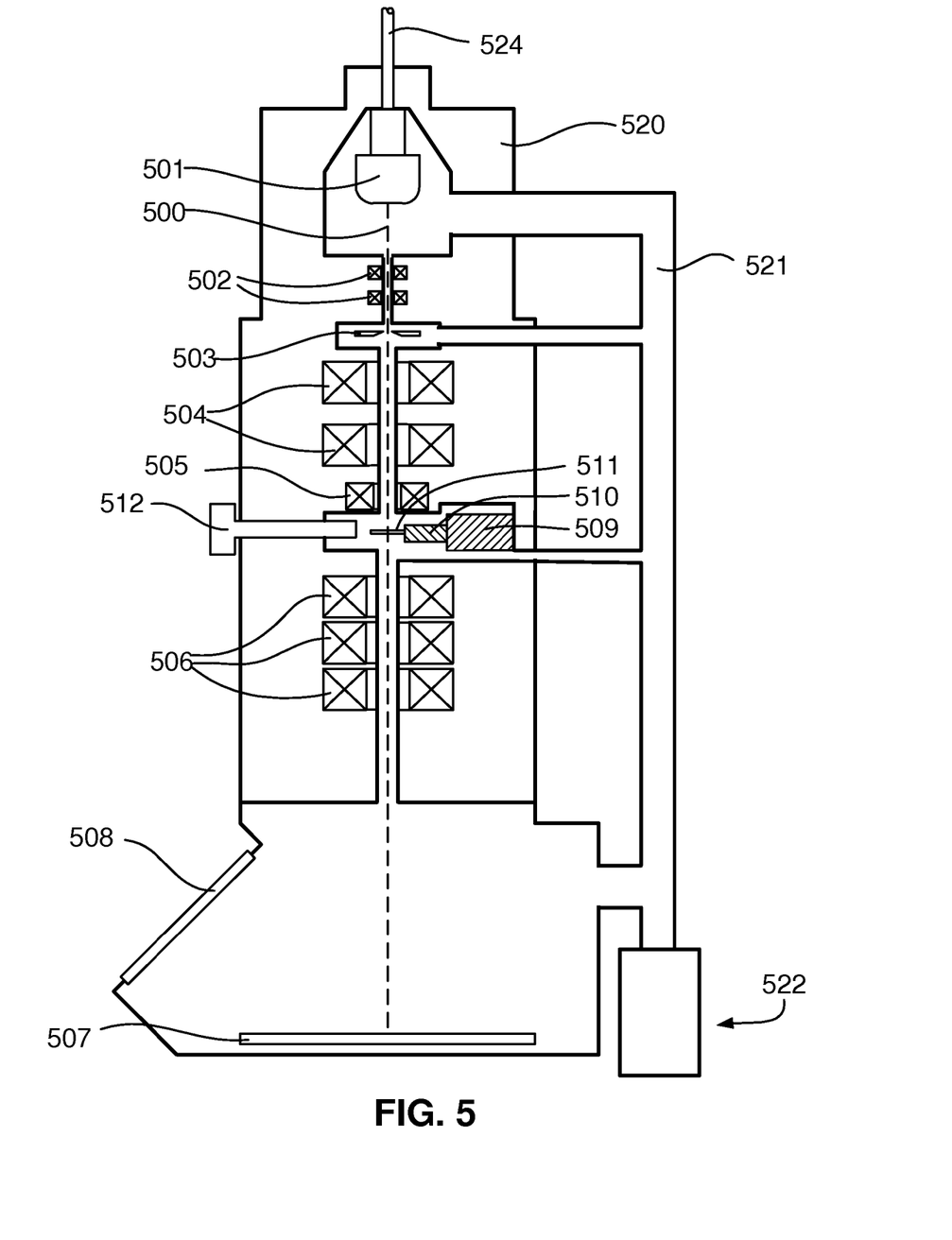
FIG. 5 schematically depicts a TEM with a manipulator according to the invention.

FIG. 5 schematically depicts a TEM with a manipulator according to the invention.

In FIG. 5 a particle source 501 produces a beam of electrons travelling round particle-optical axis 500. The particle source is fed via high voltage wire 524 to electronics (not shown), the electronics delivering appropriate voltage and current for the operation of the particle source. The beam of electrons is centred round particle-optical axis by e.g. particle-optical deflectors 502. Diaphragm 503 shows an aperture acting as a beam limiting aperture. Particle-optical lenses 502 act as a condenser for delivering the beam of electrons to the objective lens 505. A specimen mounted on specimen holder 511 is illuminated by the particle beam, and a fraction of the electrons pass through the specimen. These electrons are imaged by particle-optical lenses 506 onto a detector 507. Detector 507 can be e.g. a fluorescent screen or a CCD camera. When a fluorescent screen is used, the image may be viewed through glass window 508.

The interior of the microscope is enveloped by a vacuum wall 520, and evacuated by vacuum pump 522 via vacuum connections 521.

For positioning the specimen holder a manipulator 509 according to the invention is used, on which a sub-manipulator 510 is mounted to increase the degrees of freedom. An airlock 512 enables the introduction of a specimen mounted on a specimen holder into the evacuated interior of the TEM and the mounting of the specimen holder onto the sub-stage.

The invention claimed is:

1. A manipulator for positioning a specimen holder with sub-micron resolution, the manipulator comprising:
    a base having a base surface;
    a platform having a platform surface opposing the base surface;
    at least three nano-actuators positioned between the base surface and the platform surface, each nano-actuator including a tip, the tips defining a plane, each tip capable of moving in the plane, the nano-actuators being pressed between the base surface and the platform surface such that the nano-actuators can rotate the platform with respect to the base in the plane and translate the platform parallel to the plane; and
    a specimen holder connected to the platform.

2. The manipulator according to claim 1 in which the nano-actuators are pressed between the base surface and the platform surface with a force such that when the nano-actuators tips move at a sufficiently low speed, the base and platform move relative to each other without slippage of the nano-actuator tips against their contacting surface and when the nano-actuators tips move at a sufficiently high speed, the base and platform move relative to each other with slippage of the nano-actuator tips against their contacting surface, thereby extending the range of motion that can be effected by the nano-actuators by using multiple moves, some with slippage and some without slippage.

3. The manipulator according to claim 1 in which the nano-actuators are mounted on the platform.

4. The manipulator according to claim 1 in which the nano-actuators are mounted on the base.

5. The manipulator according to claim 1 further comprising biasing means for pressing the platform and the base toward the nano-actuators.

6. The manipulator according to claim 5 in which the biasing means comprises a coil spring or a belleville washer.

7. The manipulator according to claim 4 further comprising a second set of at least three nano-actuators, each having a tip, the tips defining a second plane, the second set of nano-actuators being positioned on a counter-base, each tip of the nano-actuators of the second set capable of moving in the second plane, the platform being pressed between the tips of the first and second sets of nano-actuators, the base and counter base being fixed relative to each other, and the platform being movable relative to the base and counterbase.

8. The manipulator according to claim 1 in which the platform or the base includes one or more smooth surfaces, each of the tips of the nano-actuators in contact with one of the one or more smooth surfaces, each of the tips equipped to move with respect to the one or more smooth surfaces.

9. The manipulator according to claim 8 in which the movement over the one or more smooth surfaces takes the form of slipping the tips over the one or more smooth surfaces.

10. The manipulator according to claim 1 in which a sub-manipulator is mounted on the platform, said sub-manipulator equipped to move the specimen holder with respect to the platform, and the specimen holder being attached to the sub-manipulator.

11. The manipulator according to claim 10 in which the sub-manipulator is equipped to position the specimen holder with additional degrees of freedom.

12. The manipulator according to claim 1 in which the nano-actuators are piezo-electric nano-actuators.

13. The manipulator according to claim 1 further comprising a rod extending from the platform, and in which the specimen holder is attached to the rod.

14. The manipulator according to claim 1 in which at least part of the base, the nano-actuators, the platform, and the specimen holder are equipped to be exposed to and to operate in a vacuum.

15. A particle-optical apparatus, comprising:
a particle source for producing a beam of particles;
one or more particle-optical lenses, each of said particle source and particle-optical lenses centred on a particle-optical axis along which the beam of particles may travel; and
a manipulator according to claim 1 for manipulating a specimen toward which the beam of particles is directed.

16. The particle-optical apparatus of claim 15 in which the particle-optical apparatus is an electron microscope.

17. The particle-optical apparatus of claim 15 in which the manipulator is equipped with a through-hole in the base and a through-hole in the platform for passing the beam of particles along the particle-optical axis.

18. The manipulator according to claim 17 in which the particle-optical axis is substantially perpendicular to the plane defined by the tips of the nano-actuators.

19. The manipulator according to claim 15 in which the particle-optical axis is substantially parallel to the plane defined by the tips of the nano-actuators.

20. A method of operating a manipulator according to claim 8, the method comprising:
repeatedly performing the steps of
moving the one or more tips with a speed sufficiently low to avoid slippage of the tips over the one or more smooth surfaces, and
moving the one or more tips with a speed sufficiently high to cause slippage of the one or more tips over the one or more smooth surfaces, thereby repositioning the one or more tips with respect to the platform,
as a result of which the platform is moved with respect to the base over a distance or over an angle of rotation larger than can be achieved without repositioning the tips with respect to the platform.

21. A method of operating a manipulator including three or more nano-actuators mounted between a base and a platform, each nano-actuator having a tip, the tips being pressed against a smooth surface of the base or the platform, comprising:
moving the tips of the three or more nano-actuators with a speed sufficiently low to avoid slippage of the tips over the smooth surface, and
moving the one or more tips with a speed sufficiently high to cause slippage of the one or more tips over the smooth surface, thereby repositioning the one or more tips with respect to the smooth surface,
as a result of which a specimen holder is moved with respect to the base over a distance or over an angle of rotation larger than can be achieved without repositioning the tips with respect to the platform.

22. The method of claim 21 further comprising repeating, at least once, the steps of:
moving the tips of the three or more nano-actuators with a speed sufficiently low to avoid slippage of the tips over the smooth surface, and
moving the one or more tips with a speed sufficiently high to cause slippage of the one or more tips over the smooth surface, thereby repositioning the one or more tips with respect to the smooth surface.

23. The method of claim 21 in which moving the tips of the three or more nano-actuators with a speed sufficiently low to avoid slippage of the tips over one or more smooth surfaces includes moving each of the tips of the three or more nano-actuators a distance of less than 1 nm.

24. The method of claim 21 in which moving the tips of the three or more nano-actuators with a speed sufficiently low to avoid slippage of the tips includes moving a specimen holder attached to the platform.

25. The method of claim 21 further comprising directing an electron beam toward a specimen in the specimen holder.

* * * * *